United States Patent
Chen et al.

[11] Patent Number: 6,063,689
[45] Date of Patent: May 16, 2000

[54] METHOD FOR FORMING AN ISOLATION

[75] Inventors: Coming Chen, Taoyuan Hsien; Water Lur, Taipei, both of Taiwan

[73] Assignee: United Microelectronics Corp., Hsinchu, Taiwan

[21] Appl. No.: 09/164,924

[22] Filed: Oct. 1, 1998

[30] Foreign Application Priority Data

Jul. 6, 1998 [TW] Taiwan ................................ 87110880

[51] Int. Cl.7 .................................................. H01L 21/76
[52] U.S. Cl. ........................ 438/424; 438/427; 438/435; 438/437; 438/692; 148/DIG. 50
[58] Field of Search ................................. 438/424, 296, 438/427, 435, 437, 692; 148/DIG. 50

[56] References Cited

U.S. PATENT DOCUMENTS

| | | | |
|---|---|---|---|
| 5,721,172 | 2/1998 | Jang et al. | 438/424 |
| 5,811,345 | 9/1998 | Yu et al. | 438/424 |
| 5,817,567 | 10/1998 | Jang et al. | 438/427 |
| 5,854,133 | 12/1998 | Hachiya et al. | 438/692 |
| 5,874,345 | 2/1999 | Coronel et al. | 438/427 |
| 5,930,645 | 7/1999 | Lyons et al. | 438/425 |

*Primary Examiner*—Trung Dang
*Attorney, Agent, or Firm*—Jiawei Huang; J.C. Patent

[57] ABSTRACT

A method for forming a shallow-trench isolation starts with forming a polysilicon layer, which has less stress, as the mask layer for patterning the trench on a provided substrate. An oxide layer is then formed to cover the polysilicon layer and fill the trench. The oxide layer is then removed by first performing a chemical mechanical polishing process to remove a portion of the oxide layer, wherein the remains of the oxide layer still covers the polysilicon layer and fills the trench. After that, an etching back process is performed to remove the oxide layer from the top of the polysilicon layer to form the oxide plug, which is used as an isolation.

13 Claims, 4 Drawing Sheets

METHOD FOR FORMING AN ISOLATION

CROSS-REFERENCE TO RELATED APPLICATION

This application claims the priority benefit of Taiwan application serial no. 87110880, filed Jul. 6, 1998, the full disclosure of which is incorporated herein by reference.

BACKGROUND OF THE INVENTION

1. Field of the Invention

This invention relates to a method for fabricating a semiconductor device, and more particularly, to a method for forming an isolation of a semiconductor device.

2. Description of Related Art

An isolation region is normally used in a crowded device region of an integrated circuit, such as a dynamic random access memory (DRAM) to prevent carriers moving through neighboring devices, such as field effect transistors (FET). Because the carriers moving through neighboring devices cause charge leakage on the FETs, isolation regions are formed to prevent the occurrence of change leakage. An isolation region normally exists in the form of a thick field oxide layer, and is formed in a semiconductor substrate. Generally, an isolation region is formed by a local oxidation (LOCOS) process. Even though the conventional process, LOCOS, is technically mature, and, reliable and cost-effective isolation regions can be obtained by employing LOCOS process, there are still shortcomings related to this conventional process. The drawbacks related to a LOCOS process includes the formation of bird's beak regions around the field isolation regions. Those drawbacks of the conventional isolation process, especially the formation of bird's beak regions, make it difficult to apply LOCOS process on the fabrication of a higher-integrated semiconductor device.

It is also a conventional method to isolate devices in a integrated circuit by using shallow-trench isolation. Generally, an anisotropic etching process is performed with using silicon nitride as a mask to form steep trenches on a semiconductor substrate. Then, by filling the trenches with oxide, shallow-trench isolations, which have top surfaces are in level with the top surface of the substrate, are formed on the substrate.

FIGS. 1A through 1E are cross-sectional views showing a conventional method forming a shallow-trench isolation.

Referring to FIG. 1A, a oxide 22 is formed on a silicon substrate 10 as a pad oxide layer for protecting the substrate 10, wherein the oxide layer 22 is removed before the formation of a gate oxide layer. A silicon nitride layer 24 is formed on the substrate by performing a chemical vapor deposition (CVD). Then, an etching process is performed on the substrate 10 by using a patterned photoresist layer 28 as a mask to form a trench 30 on the substrate 10, wherein the photoresist layer 28 is removed after the etching process.

Because the stress of the silicon nitride layer 24 is relatively strong, it tends to cause damages on the substrate 10. Therefore, a thick silicon nitride layer 24 leads to the cracking of the substrate 10.

Referring to FIG. 1B, a linear oxide layer 31 is formed in the trench 30 by performing a thermal oxidation process, and then, a silicon oxide layer 32 is filled in the trench 32 and on the surface of the substarte 10.

Referring to FIG. 1C, the oxide layer 32 on the silicon nitride layer 24 is removed by performing a chemical mechanical polishing (CMP) process after a densification process is performed on the oxide layer 32, to form oxide plugs 34. However, the slurry used in the CMP process generates micro scratches 25 on the surface of the oxide plugs that is difficult to be recovered. In addition, a long-period polishing process also tends to cause the dishing problem, which degrades the uniformity of the wafer.

Referring to FIG. 1D, the silicon nitride layer 24 is stripped by using hot phosphoric acid.

Referring next to FIG. 1E, the entire wafer is doused in hydrogen fluoride (HF) for removing the pad oxide layer 22. Even though the oxide plugs 34 are partially removed by the process of removing the pad oxide layer 22, the scratches 35 still remain on the surface of the oxide plugs 34. Those scratches 35 on the surface of the oxide plugs 34 cause bridging defects or even short circuits in the follow-up process that degrades the yield.

SUMMARY OF THE INVENTION

It is therefore an objective of the present invention to provide a method to reducing the scratches on the surface of the oxide plugs of a shallow-trench isolation for avoiding the occurrence of bridging defects and short circuits to improve the yield.

It is another an objective of the present invention to provide a method to prevent damages and cracking occurring on the substrate caused by the stress of the mask layer.

It is still another objective of the present invention to provide a method to prevent the occurrence of degraded uniformity and dishing problem on surface of the wafer.

In accordance with the foregoing and other objectives of the present invention, the invention provides a method for forming a shallow-trench isolation that includes using a polysilicon layer, which has less stress, as the mask layer for patterning the trench. An oxide layer is then formed to cover the polysilicon layer and fill the trench. The oxide layer is then removed by first performing a chemical mechanical polishing process to remove a portion of the oxide layer, wherein the remains of the oxide layer still covers the polysilicon layer and fills the trench. After that, an etching back process is performed to remove the oxide layer from the top of the polysilicon layer to form the oxide plug, which is used as an isolation.

It is a specificity of the invention using polysilicon layer as a mask for forming a trench on the substrate. Because the stress of a polysilicon layer is less than what of a silicon nitride layer, which is conventionally used, the damages of the substrate caused by a conventional mask is avoided. Even though the polysilicon layer of the invention is thicker than a conventional silicon nitride layer, it still does not cause the cracking of the substrate.

It is another specificity of the invention that the oxide layer is removed by firstly performing a CMP process on the oxide layer, and, followed by performing an etching back process on the remaining oxide layer. Because of the additional etching back process, the number of scratches on the wafer caused by simply performing a CMP process is reduced, and the dishing problem caused by a long-time CMP process is improved as well.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for forming a shallow-trench isolation as shown in FIGS. 2A through 2E.

Figure 1A:
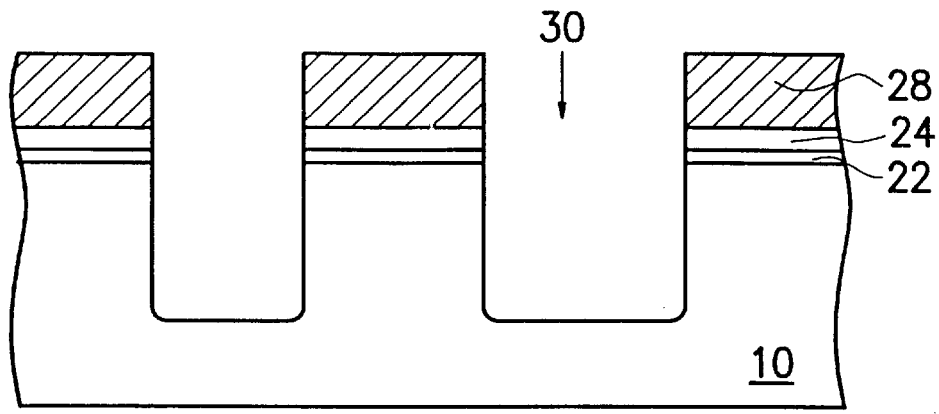
FIGS. 1A through 1E are cross-sectional views showing a conventional method for forming a shallow-trench isolation.
Figure 1B:
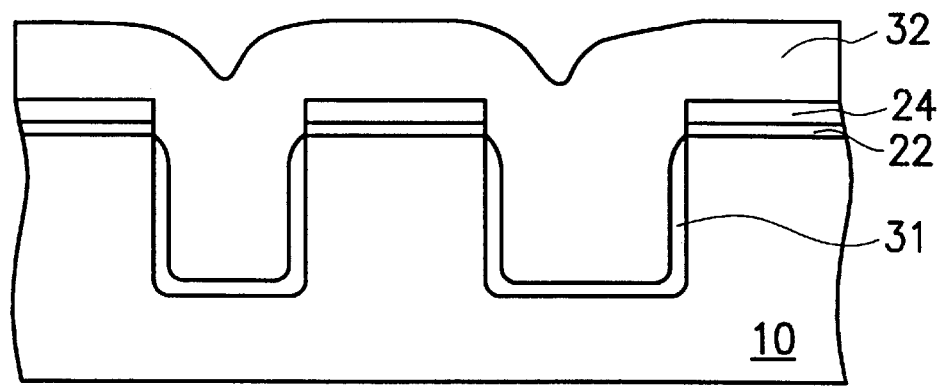
Figure 1C:
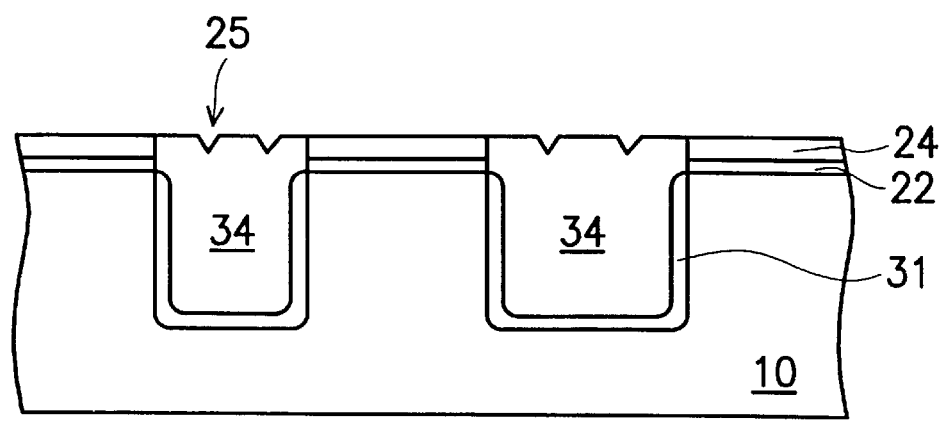
Figure 1D:
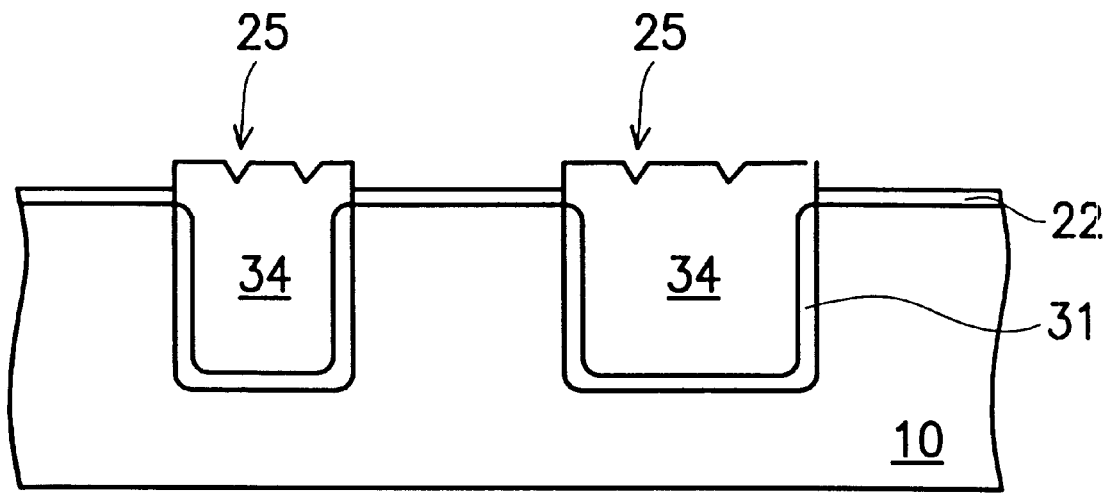
Figure 1E:
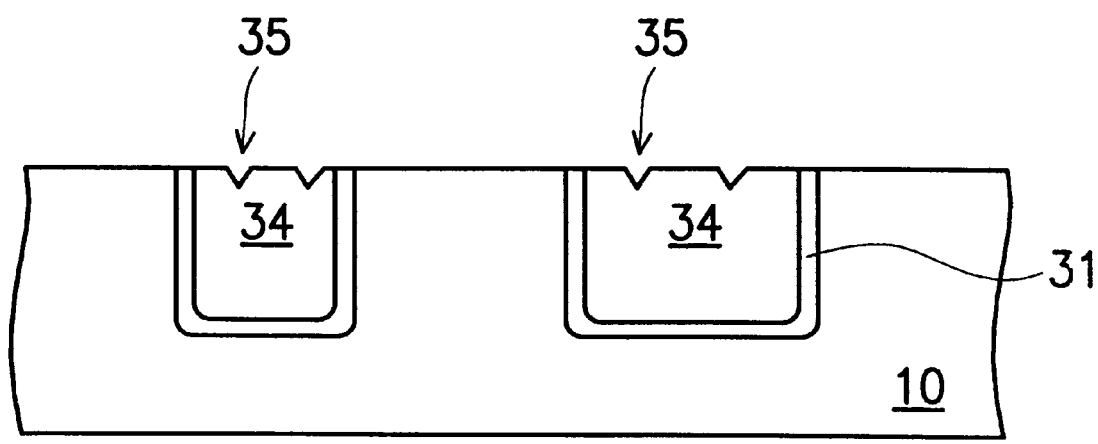
Figure 2A:
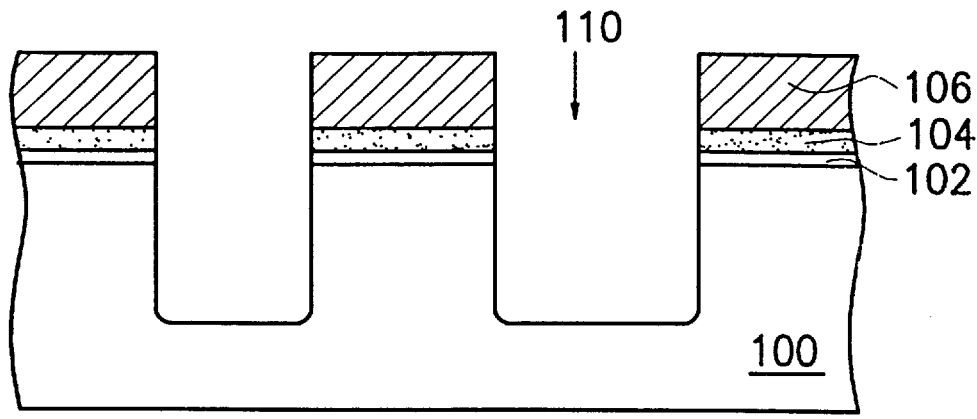
FIGS. 2A through 2E are cross-sectional views showing the method for forming a shallow-trench isolation of a preferred embodiment according to the invention.

Referring to FIG. 2A, a pad oxide layer 102 is formed on a provided silicon substrate 100, wherein the substarte 100 includes a P-type doped surface layer. The pad oxide layer 102 is used to protect the substrate 100 from damages caused by the following processes, such as a thermal oxidation process, wherein the thickness of the pad oxide layer 102 is about 50 to 500 Å. A polysilicon layer 104 is formed on the pad oxide layer 102 as a mask for the follow-up etching process, wherein the polysilicon mask 104 is one of the specificity of the invention.

Because the stress within a polysilicon layer 104 is much less than what within a silicon nitride layer, which is used as a mask in a conventional method, the damage on the substrate 100 caused by the stress from the mask thereon is reduced. Even though the polysilicon mask 104 of the invention is thicker than a silicon nitride mask used in a conventional method, the substrate 100 still doesn't crack. Furthermore, removing a polysilicon layer is easier than removing a silicon nitride layer.

The polysilicon layer 104 and the pad oxide layer 102 are patterned by performing an anisotropic etching process with a patterned photoresist layer 106 to form trenches 110, wherein the etching process includes a dry etching or a wet etching process. The depth of the trenches 110 is about 2000 to 5000 Å.

Figure 2B:
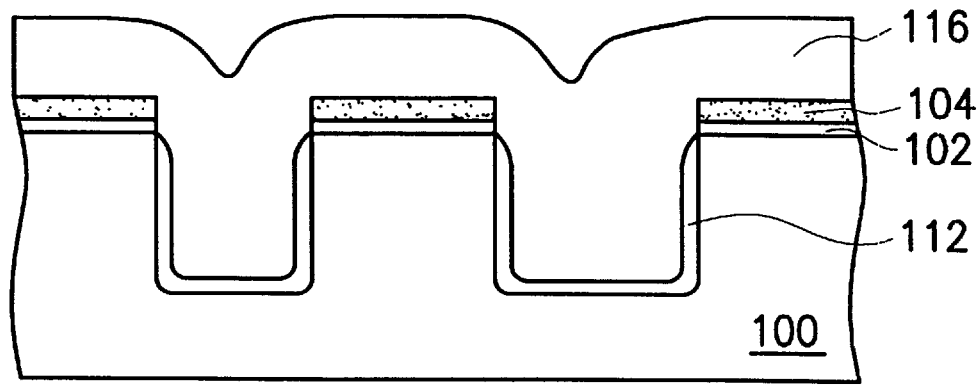

Referring to FIG. 2B, a linear oxide layer 112 is formed on the surface within the trenches 110 by performing a thermal oxidation process. A oxide layer 116 is next to be formed on the substrate 100 and filled into the trenches 110 by performing a chemical vapor deposition.

Figure 2C:
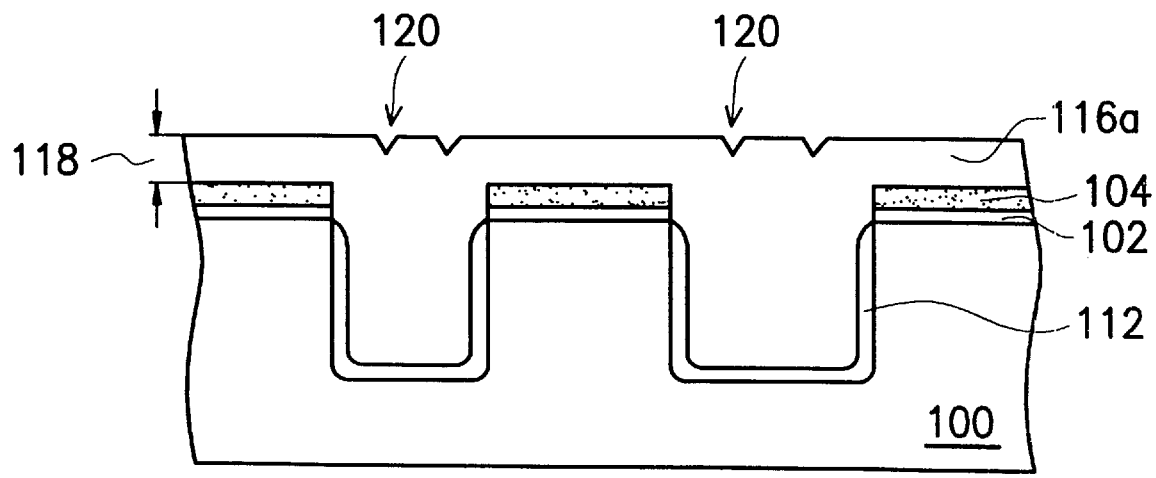
Figure 2D:
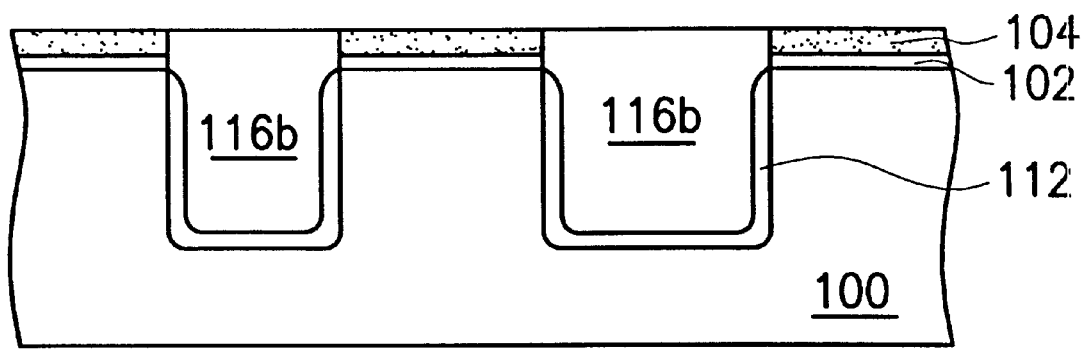

Referring next to FIGS. 2C and 2D, the oxide layer 116 is removed by performing a CMP process, as shown in FIG. 2C, and an etching back process, as shown in FIG. 3D. After a CMP process is performed on the oxide layer 116, most of the oxide layer 116 is removed, and micro scratches are formed on the surface of the remains of the oxide layer 116, 116a. The remaining oxide layer 116a still covers the substrate 100 and fills the trenches 110. Then, by performing an etching back process, such as a dry etching on the remaining oxide layer 116a, the oxide layer 116a located on the top of the polysilicon layer 104 is removed to form the oxide plugs 116b. Because the oxide layer 116a that covers the polysilicon layer 104 is removed by an etching process, which doesn't include slurry and polishing particles, the scratches 120 on the oxide layer 116a are erased.

Figure 2E:
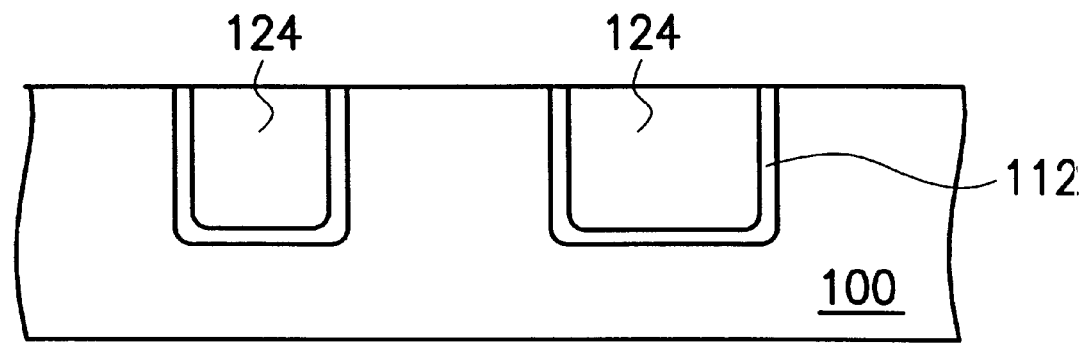

Referring to FIG. 2E, the polysilicon layer 104 is also removed by an etching process, such as a dry etching process. Then, by sinking the wafer into HF, the pad oxide layer 102 is removed to form the oxide plugs 124. Since the rest of the process is known by people skilled in this art, so it is not described hereon.

The specificity of the invention includes:
1. Using polysilicon layer, which has less stress, as an etching mask to prevent the substrate from cracking;
2. Removing the oxide layer by performing a CMP process first, and followed by performing an etching process to prevent the occurrence of scratches on the surface of the oxide plugs, so that the happening of bridging or short-circuit defects is reduced; and
3. Performing CMP on the wafer for a shorter period of time to prevent the dishing problem caused by a long-time CMP process.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a shallow-trench isolation, the method comprising:

providing a substrate;

forming a mask layer on the substrate;

patterning the mask layer and the substrate to form a trench;

forming an oxide layer on the mask layer and in the trench;

performing a chemical mechanical polishing process to remove a portion of the oxide layer, wherein a remaining portion of the oxide layer still covers the mask layer and the trench;

after the chemical mechanical polishing process is performed, performing an etching back process to remove the remaining portion of the oxide layer from the top of the mask layer by using the mask layer as an etching stop, wherein the etching back process is capable of preventing scratch formation on a surface of the oxide layer; and removing the mask layer to expose the substrate.

2. The method of claim 1, wherein the step of forming the mask layer further comprises forming a pad oxide layer on the substrate before the formation of the mask layer.

3. The method of claim 1, wherein the mask layer includes polysilicon.

4. The method of claim 1, wherein the step of forming the oxide layer includes a chemical vapor deposition process.

5. The method of claim 1, wherein the step of forming the oxide layer further comprises forming a linear oxide layer in the trench before the formation of the oxide layer.

6. The method of claim 1, wherein the step of removing the mask layer includes a dry etching process.

7. A method for forming a shallow-trench isolation, the method comprising:

providing a substrate;

forming a polysilicon layer on the substrate;

patterning the polysilicon layer and the substrate to form a trench;

forming an oxide layer on the polysilicon layer and in the trench;

polishing a portion of the oxide layer, wherein a remaining portion of the oxide layer still covers the polysilicon layer and the trench, wherein at least a scratche is formed on a surface of the oxide layer; and after the polishing step is performed, etching the remaining portion of the oxide layer from the top of the polysilicon layer to expose the polysilicon layer, wherein the etching step is capable of removing the scratch.

8. The method of claim 7, wherein the step of forming the polysilicon layer further comprises forming a pad oxide layer on the substrate before the formation of the polysilicon layer.

9. The method of claim 7, wherein the step of forming the oxide layer includes a chemical vapor deposition process.

10. The method of claim 7, wherein the step of forming the oxide layer further comprises forming a linear oxide layer in the trench before the formation of the oxide layer.

11. The method of claim 7, wherein the step of polishing the portion of the oxide layer includes s chemical mechanical polishing.

12. The method of claim 7, wherein the step of etching the remaining portion of the oxide layer includes an etching back process.

13. The method of claim 7, wherein the step of etching the remaining portion of the oxide layer includes a dry etching process.

* * * * *